(12) United States Patent
Watsuji et al.

(10) Patent No.: US 7,938,988 B2
(45) Date of Patent: May 10, 2011

(54) PASTE COMPOSITION AND SOLAR CELL ELEMENT USING THE SAME

(75) Inventors: Takashi Watsuji, Osaka (JP); Haruzo Katoh, Osaka (JP); Ken Kikuchi, Osaka (JP)

(73) Assignee: Toyo Aluminium Kabushiki Kaisha, Osaka (JP)

( * ) Notice: Subject to any disclaimer, the term of this patent is extended or adjusted under 35 U.S.C. 154(b) by 737 days.

(21) Appl. No.: 11/587,153

(22) PCT Filed: Jun. 23, 2005

(86) PCT No.: PCT/JP2005/011511
§ 371 (c)(1),
(2), (4) Date: Oct. 20, 2006

(87) PCT Pub. No.: WO2006/003830
PCT Pub. Date: Jan. 12, 2006

(65) Prior Publication Data
US 2007/0221270 A1  Sep. 27, 2007

(30) Foreign Application Priority Data
Jul. 1, 2004  (JP) .................................. 2004-195469

(51) Int. Cl.
*H01B 1/22* (2006.01)
(52) U.S. Cl. ..................... 252/512; 252/500; 252/518.1; 136/252; 136/256; 136/261
(58) Field of Classification Search .................. 252/500, 252/512, 518.1; 106/287.14; 136/256, 261, 136/252; 204/243.1; 430/281.1
See application file for complete search history.

(56) References Cited

U.S. PATENT DOCUMENTS

| | | | | |
|---|---|---|---|---|
| 5,676,807 A * | 10/1997 | de Nora et al. | ............ | 204/243.1 |
| 5,972,564 A * | 10/1999 | Kawana et al. | ............ | 430/281.1 |
| 6,525,468 B1 * | 2/2003 | Wada et al. | .................... | 313/510 |
| 6,695,903 B1 * | 2/2004 | Kubelbeck et al. | ....... | 106/287.14 |
| 7,368,657 B2 * | 5/2008 | Watsuji et al. | ................. | 136/256 |
| 2004/0055635 A1* | 3/2004 | Nagakubo et al. | ............ | 136/261 |
| 2004/0245507 A1* | 12/2004 | Nagai et al. | .................... | 252/500 |

FOREIGN PATENT DOCUMENTS

| | | | |
|---|---|---|---|
| JP | 200-090734 | * | 3/2000 |
| JP | 2000-90734 A | | 3/2000 |
| JP | 2003-69056 A | | 7/2003 |
| JP | 2003-223813 A | | 8/2003 |
| JP | 2004-134775 A | | 4/2004 |
| WO | WO 03/023790 A1 | * | 3/2003 |

* cited by examiner

*Primary Examiner* — Mark Kopec
*Assistant Examiner* — Khanh Tuan Nguyen
(74) *Attorney, Agent, or Firm* — Birch, Stewart, Kolasch & Birch, LLP

(57) ABSTRACT

Provided are: a paste composition which is capable of keeping a desired function for a backside electrode of a solar cell and strengthening the bond between an aluminum electrode layer and a p type silicon semiconductor substrate even if glass frit as a substance giving a bad effect on the environment is not incorporated into the composition or the content of glass frit as a substance giving a bad effect on the environment therein is decreased; and a solar cell element provided with an electrode formed by use of the composition. The paste composition is a paste composition for forming an aluminum electrode layer (8) over a p type silicon semiconductor substrate (1), comprising aluminum powder, an organic vehicle, and a metal alkoxide. The solar cell element provided with the aluminum electrode layer (8) formed by applying the paste composition having the above-mentioned characteristic to the p type silicon semiconductor substrate (1) and then firing the resultant.

7 Claims, 1 Drawing Sheet

PASTE COMPOSITION AND SOLAR CELL ELEMENT USING THE SAME

TECHNICAL FILED

This invention relates generally to a paste composition and a solar cell element using the same, and in particular to a paste composition used at the time of forming a backside aluminum electrode on a p type silicon semiconductor substrate which constitutes a crystalline silicon solar cell, and a solar cell element using the same.

BACKGROUND ART

It is desired that solar cells are put to practical use, as clean energy sources which are safe and give no bad effect on the environment, within a wider scope.

FIG. 1 is a view which schematically illustrates an ordinary sectional structure of a solar cell element.

As illustrated in FIG. 1, an n type impurity layer 2 having a thickness of 0.3 to 0.5 µm, an antireflection layer 3, and grid electrodes 4 are successively formed on the side of a light-receiving face of a p type silicon semiconductor substrate 1 having a thickness of 300 to 600 µm.

An aluminum electrode layer 8 is formed as a backside electrode on the backside of the p type silicon semiconductor substrate 1. The aluminum electrode layer 8 is composed of an aluminum sintered layer 5 and an aluminum silicon mixed layer 6, and is formed by applying a paste composition comprising aluminum powder, glass frit, and an organic vehicle by screen printing or the like, drying the composition, and then firing the composition at a temperature of 660° C. (the melting point of aluminum) or higher. At the time of this firing, aluminum diffuses into the p type silicon semiconductor substrate 1, thereby forming the aluminum silicon mixed layer 6 between the aluminum sintered layer 5 and p type silicon semiconductor substrate 1 and simultaneously forming a $p^+$ layer (or $p^{++}$ layer) 7 as a diffused layer based on the diffusion of aluminum atoms. By the presence of this $p^+$ layer 7, the BSF (back surface field) effect of improving the efficiency of collecting generated carries is produced. Actually, the backside electrode is used in the form of the following cases: the case that the three layers of the aluminum sintered layer 5, the aluminum silicon mixed layer 6, and the $p^+$ layer 7 that are fired are used as they are; and the case that the aluminum sintered layer 5, which is fired, or the aluminum sintered layer 5 and the aluminum silicon mixed layer 6 that are fired are removed by a chemical method or the like in order to decrease the electric resistance, and then an electrode layer made of silver or copper is formed on the surface and used. In any one of the cases, the $p^+$ layer 7 exhibits the BSF effect.

The paste composition used to form the aluminum electrode layer 8 as the backside electrode generally comprises aluminum power, glass frit, and an organic vehicle.

The aluminum powder is added in an amount of about 60 to 80% by mass in order to form the aluminum sintered layer 5, the aluminum silicon mixed layer 6, and the $p^+$ layer 7 based on the diffusion of aluminum atoms.

The glass frit is added in an amount of about 1 to 5% by mass in order to strengthen the bond between the aluminum electrode layer 8 and the p type silicon semiconductor substrate 1 by use of the effect that the frit is melted without being volatilized at the time of the firing and is re-solidified when the frit is cooled.

The organic vehicle is added in an amount of about 15 to 40% by weight in order to improve the applicability or printability of the paste composition when the composition is applied by screen printing or the like.

Since attention is paid to solar cells as clean energy sources which are safe and give no bad effect on the environment, one theme for putting the solar cells to practical use within a wide scope is to remove or decrease materials giving bad effect on the environment from constituents of the solar cells.

Incidentally, paste compositions are variously investigated in order to keep desired functions for the backside electrode of a solar cell while preventing the p type silicon semiconductor substrate from being warped or cracked at the time of firing.

Japanese Unexamined Patent Publication No. 2000-90734 (Patent Document 1) discloses an electroconductive paste containing an aluminum-containing organic compound besides aluminum powder, glass frit and an organic vehicle as an electroconductive paste capable of keeping desired functions for the backside electrode of a solar cell, and making an aluminum electrode layer thin in order to prevent the p type silicon semiconductor substrate from being warped or cracked at the time of firing.

Japanese Unexamined Patent Publication No. 2003-223813 (Patent Document 2) discloses a paste composition which contains, besides aluminum powder and an organic vehicle, an inorganic compound wherein the thermal expansion coefficient is smaller than that of aluminum and any one of the melting temperature, the softening temperature and the decomposition temperature is higher than the melting point of aluminum as a paste composition which makes it possible to attain a desired BSF effect sufficiently without decreasing the coating amount even if a p type silicon semiconductor substrate is made thin, and further restrain the deformation of the p type silicon semiconductor substrate fired.

Furthermore, Japanese Unexamined Patent Publication No. 2004-134775 (Patent Document 3) discloses an electroconductive paste composition containing aluminum powder, glass frit and an organic vehicle and further containing at least one species out of organic compound particles slightly-soluble or insoluble in the organic vehicle and carbon particles as an electroconductive paste composition for keeping a desired function for a backside electrode of a solar cell while making the shrinkage of an aluminum electrode layer small at the time of firing, thereby preventing the generation of warps or cracks.

However, in the paste compositions disclosed in these publications also, glass frit is used as an essential component in the present situation. Hitherto, lead-containing glass, which gives a bad effect on the environment, has been used as the glass frit.

Thus, the use of a lead-free glass such as $Bi_2O_3$—$SiO_2$—$B_2O_3$ based or ZnO based glass, instead of a lead-containing glass such as $SiO_2$—$PbO_2$ based or $SiO_2$—$B_2O_3$—PbO based glass, has been investigated from the viewpoint of not giving any bad effect on the environment.

However, the lead-free glass has problems that the glass has a high melting point, and thus in order to melt the glass homogeneously, the firing temperature rises and the firing time becomes long.

Patent Document 1: Japanese Unexamined Patent Publication No. 2000-90734
Patent Document 2: Japanese Unexamined Patent Publication No. 2003-223813
Patent Document 3: Japanese Unexamined Patent Publication No. 2004-134775

DISCLOSURE OF THE INVENTION

Problems to be Solved by the Invention

Thus, an object of this invention is to solve the above-mentioned problems, and provide: a paste composition which is capable of keeping a desired function for a backside electrode of a solar cell and strengthening the bond between an aluminum electrode layer and a p type silicon semiconductor substrate even if glass frit as a substance giving a bad effect on the environment is not incorporated into the composition or the content of glass frit as a substance giving a bad effect on the environment therein is decreased; and a solar cell element provided with an electrode formed by use of the composition.

Means for Solving the Problems

The inventors have eagerly repeated researches in order to solve the problems in the prior art, so as to find out that the above-mentioned object can be attained by use of a paste composition having a specific composition. On the basis of the finding, the paste composition according to the present invention has the following characteristics.

The paste composition according to an aspect of this invention is a paste composition for forming an electrode over a p type silicon semiconductor substrate, comprising aluminum powder, an organic vehicle, and a metal alkoxide. The wording "metal alkoxide" means an alkoxide containing a metal, a semimetal or a semiconductor as a "metal".

The paste composition according to the aspect of this invention preferably comprises 60 to 75% (inclusive) by mass of the aluminum powder, 10 to 35% (inclusive) by mass of the organic vehicle, and 0.1 to 20% (inclusive) by mass of the metal alkoxide.

The paste composition according to a different aspect of this invention is a paste composition for forming an electrode over a p type silicon semiconductor substrate, comprising aluminum powder, an organic vehicle, and sol and/or gel obtained by hydrolyzing a metal alkoxide and polycondensing the resultant. The wording "metal alkoxide" means an alkoxide containing a metal, a semimetal or a semiconductor as a "metal".

The paste composition according to the different aspect of this invention preferably comprises 60 to 75% (inclusive) by mass of the aluminum powder, 10 to 35% (inclusive) by mass of the organic vehicle, and 0.1 to 20% (inclusive) by mass of the sol and/or gel obtained by hydrolyzing the metal alkoxide and polycondensing the resultant.

Preferably, in the paste composition according to the aspect of the invention or the paste composition according to the different aspect of the invention, the metal alkoxide is a metal alkoxide containing silicon as its metal.

Preferably, the paste composition according to the aspect of the invention or the paste composition according to the different aspect of the invention further comprises particles of at least one species selected from the group consisting of inorganic compound particles, organic compound particles and carbon particles. In this case, the average particle size of the inorganic compound particles and/or the organic compound particles is preferably 10 μm or less. The average particle size of the carbon particles is preferably 1 μm or less.

Furthermore, preferably, the paste composition according to the aspect of the invention or the paste composition according to the different aspect of the invention further comprises glass frit.

The solar cell element according to this invention comprises an electrode formed by applying a paste composition having any one of the above-mentioned characteristics to a p type silicon semiconductor substrate, and then firing the resultant. In this case, it is preferred that a compound of the metal contained in the metal alkoxide is formed between the p type silicon semiconductor substrate and the electrode.

Advantageous Effect of the Invention

As described above, according to this invention, a p type silicon semiconductor substrate to which a paste composition comprising a metal alkoxide, or sol and/or gel obtained by hydrolyzing a metal alkoxide and polycondensing the resultant is applied is fired, thereby making it possible to yield: a paste composition which is capable of keeping a desired BSF effect for a backside electrode of a solar cell and a desired energy converting efficiency of the solar cell, and further capable of strengthening the bond between an aluminum electrode layer and the p type silicon semiconductor substrate even if glass frit is not contained therein as a substance giving a bad effect on the environment or the content of the glass frit as a substance giving a bad effect on the environment is decreased; and a solar cell element provided with an electrode formed by use of the composition.

EXPLANATION OF REFERENCE NUMBERS

1: p type silicon semiconductor substrate, 2: n type impurity layer, 3: antireflection film, 4: grid electrode, 5: aluminum sintered layer, 6: aluminum silicon mixed layer, 7: $p^+$ layer, 8: aluminum electrode layer

BEST MODE FOR CARRYING OUT THE INVENTION

The paste composition of this invention is characterized by comprising aluminum powder and an organic vehicle and further comprising a metal alkoxide, or sol and/or gel obtained by hydrolyzing a metal alkoxide and polycondensing the resultant. The metal alkoxide is one species out of metalorganic compounds, and is a compound having at least one M—O—C bond wherein M: a metal, a semimetal or a semiconductor. The metal alkoxide is classified into many species, examples of which include: compounds different in accordance with the species of the metal element therein or valence thereof, the species of the alkoxy group therein, or the combination thereof; double alkoxides each comprising two metal species; and those partially substituted with one or more different organic groups.

About the paste composition of this invention, a metal alkoxide in a normal state or a metal alkoxide in the state of sol and/or gel obtained by hydrolysis and polycondensation may be incorporated into the composition. For example, when tetramethoxysilane, water, methanol and ammonia are mixed with each other at a mole ratio of $1:10:2.2:3.7 \times 10^{-4}$ and the mixture is hydrolyzed and polycondensed, a siloxane in a sol state is produced. When the reaction further advances, a siloxane in a gel state is obtained.

When the paste composition comprising the metal alkoxide is applied to a p type silicon semiconductor substrate and the resultant is fired and cooled, a metal compound such as its metal oxide produced by thermal decomposition of the metal alkoxide is densely formed between the resultant aluminum electrode layer and the p type silicon semiconductor substrate. Thus, the bond between the aluminum electrode layer and the p type silicon semiconductor substrate can be strengthened.

In the prior art, there is substantially not any effective means for strengthening the bond between a fired aluminum electrode layer and a p type silicon semiconductor substrate other than addition of glass frit to a paste composition; however, when the paste composition of the invention is used, the above-mentioned bond can be strengthened without the incorporation of glass frit into the composition or, even if glass frit is incorporated into the composition, with the incorporation of a decreased amount of the glass frit.

Figure 1:
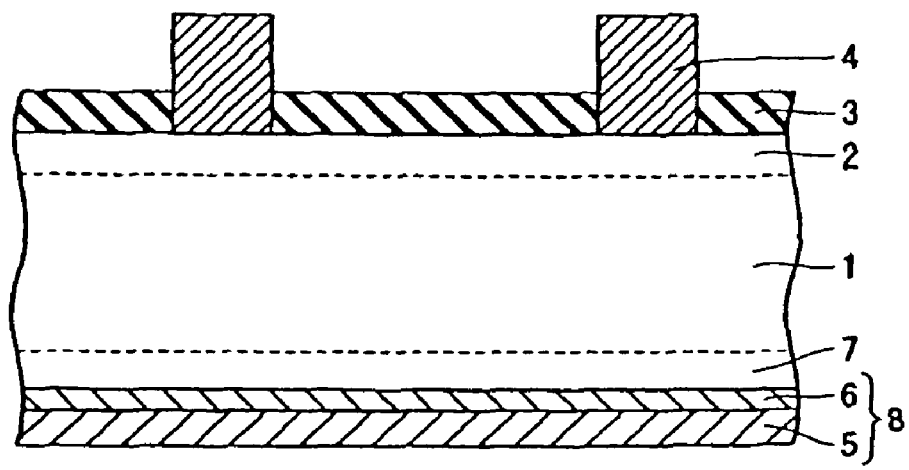
FIG. 1 is a view which schematically illustrates, as an embodiment, an ordinary sectional structure of a solar cell element to which the invention is applied.

In recent years, in response to a request that a film of a solar cell element should be made thin, its silicon semiconductor substrate has been made thin and an electroconductive paste has been applied into a thin film. In this case, according to glass frit having an average particle size of about 1 to 2 μm, which is ordinarily used, spots where the bond between a sintered aluminum electrode layer 8 and a p type silicon semiconductor substrate 1 illustrated in FIG. 1 is weak are generated since the glass frit is present in the form of points in the paste composition. Thus, a problem that the force of the bond becomes uneven is also caused. As a result, it is feared that the aluminum electrode layer 8 exfoliates.

When lead-free glass, which has a high melting point, is used as glass frit not to give a bad effect on the environment, melting and re-solidification of the glass in the form of particles become more uneven. Thus, the possibility that the aluminum electrode layer 8 exfoliates becomes large. In order to make the melting and re-solidification of the particulate glass even, it is necessary to make the firing temperature high and make the firing time long since the melting point of the lead-free glass frit is high. Accordingly, the sintering of an aluminum sintered layer 5 advances excessively, and an aluminum silicon mixed layer 6 is excessively formed to cause an increase in the deformation amounts of a warp and others of the p type silicon semiconductor substrate 1, a swelling (blister) of the aluminum sintered layer 5, generation of aluminum balls on the surface, and others. As a result, the resultant comes not to be used as a solar cell element.

About the paste composition of this invention, it is unnecessary to incorporate glass frit into the composition in order to strengthen the bond between the fired aluminum electrode layer and p type silicon semiconductor substrate, or it is possible to decrease the content of glass frit which contributes to the strengthening of the bond between the fired aluminum electrode layer and p type silicon semiconductor substrate; therefore, the possibility that a substance giving a bad effect on the environment is used can be removed, or even if glass frit is incorporated as a substance giving a bad effect on the environment, the content of the substance, which gives a bad effect on the environment, can be decreased. In the paste composition of this invention, the use of lead-free glass, which has a high melting point, is unnecessary, or even if lead-free glass is incorporated into the composition, the content of the lead-free glass can be decreased. Accordingly, the aluminum electrode layer does not exfoliate, and the adhesive property between the fired aluminum electrode layer and p type silicon semiconductor substrate can be made high. Thus, deformations of the p type silicon semiconductor substrate, such as a warp thereof, can be made smaller, as compared with the case that lead-free glass is used.

As the metal alkoxide incorporated into the paste composition of the invention, any material out of aluminum butoxide, titanium propoxide, boron methoxide and others can be preferably used. It is particularly preferred to use a metal alkoxide containing silicon, such as tetraethoxysilane. It is also allowable to incorporate into the paste composition of the invention a metal alkoxide in the state of sol and/or gel which is obtained by hydrolyzing any one of these metal alkoxides and polycondensing the resultant. For example, tetraethoxysilane is hydrolyzed and polycondensed, thereby producing siloxane in a sol state. When the reaction advances further, a product in a gel state is obtained.

The content of the metal alkoxide incorporated into the paste composition of the invention or the content of the sol and/or gel obtained by hydrolyzing a metal alkoxide and polycondensing the resultant is preferably from 0.1 to 20% (inclusive) by mass. If the content of the metal alkoxide or the content of the sol and/or gel obtained by hydrolyzing the metal alkoxide and polycondensing the resultant is less than 0.1% by mass, the effect of the addition sufficient for strengthening the bond between the fired aluminum electrode layer and p type silicon semiconductor substrate cannot be obtained. If the content of the metal alkoxide or the content of the sol and/or gel obtained by hydrolyzing the metal alkoxide and polycondensing the resultant is more than 20% by mass, a metal compound generated after the firing makes the electric resistance of the aluminum sintered layer high, so that properties of the solar cell decline.

Furthermore, the metal alkoxide, or the sol and/or gel obtained by hydrolyzing a metal alkoxide and polycondensing the resultant, which is/are incorporated into the paste composition of the invention, can be partially used instead of the organic vehicle by use of the nature of the alkoxy group thereof.

The aluminum powder incorporated into the paste composition of the invention preferably has an average particle size of 10 μm or less. If the average particle size is more than 10 μm, the number of contact points between the aluminum power and the silicon semiconductor substrate becomes small at the time of applying the paste composition. Thus, after the firing, an even aluminum silicon alloy layer may not be obtained.

The content of the aluminum powder incorporated into the paste composition of the invention is preferably from 60 to 75% (inclusive) by mass. If the content of the aluminum powder is less than 60% by mass, the surface resistance of the fired aluminum electrode layer increases, so that a fall in the energy converting efficiency may be caused. If the content of the aluminum powder is more than 75% by mass, the applicability of the paste falls at the time of screen-printing the paste.

As the organic vehicle incorporated into the paste composition of the invention, a solvent in which various additives and a resin are dissolved if necessary is used.

The solvent that can be used may be a known solvent, and specific examples thereof include diethylene glycol monobutyl ether, diethylene glycol monobutyl ether acetate, and dipropylene glycol monomethyl ether.

Examples of the various additives that can be used include an antioxidant, a corrosion inhibitor, an antifoamer, a thickener, a plasticizer, a dispersing agent, a tackifier, a coupling agent, an electrostatic supplier, a polymerization inhibitor, a thixotropy agent, and a sedimentation inhibitor.

Specifically, for example, the following can be used: polyethylene glycol ester compounds, polyethylene glycol ether compounds, polyoxyethylene sorbitan ester compounds, sorbitan alkyl ester compounds, aliphatic polyhydric carboxylic acid compounds, phosphoric acid esters (phosphates), amideamine salts of a polyester acid, polyethylene oxide compounds, aliphatic acid amide wax, and so forth.

The resin that can be used may one or more known ones, and may be one or a combination of two or more out of ethylcellulose, nitrocellulose, polyvinyl butyral, phenol resin, melamine resin, urea resin, xylene resin, alkyd resin, unsaturated polyester resin, acrylic resin, polyimide resin, furan resin, urethane resin, thermosetting resins made from an isocyanate compound or cyanate compound, polyethylene, polypropylene, polystyrene, ABS resin, polymethyl methacrylate, polyvinyl chloride, polyvinylidene chloride, polyvinyl acetate, polyvinyl alcohol, polyacetal, polycarbonate, polyethylene terephthalate, polybutylene terephthalate, polyphenyleneoxide, polysulfone, polyimide, polyethersulfone, polyarylate, polyetheretherketone, polyethylene tetrafluoride, and silicon resin. The organic vehicle incorporated into the paste composition of the invention may be an organic vehicle dissolving no resin.

The content of the organic vehicle is preferably from 10 to 35% (inclusive) by mass. If the content of the organic vehicle is less than 10% by mass or more than 35% by mass, the printability of the paste lowers.

The paste composition of the invention may further contain glass frit in order to strengthen the bond between the aluminum electrode layer and the p type silicon semiconductor substrate. The content of the glass frit is preferably 5% or less by mass. If the content of the glass frit is more than 5% by mass, the glass may segregate. In this case, it is most preferred to use, as the glass frit, lead-free glass, which gives no bad effect on the environment. However, lead-containing glass may be used to relieve, as much as possible, the above-mentioned problem based on the matter that the melting point of the lead-free glass is high. Even when lead-containing glass is used as the glass frit, the content of substances giving a bad effect on the environment can be decreased in the paste composition of the invention since the content of the lead-containing glass which contributes to the above-mentioned bond can be made lower than in the prior art.

The paste composition of the invention may further contain at least one species selected from the group consisting of inorganic compound particles, organic compound particles and carbon particles in order to prevent deformations, such as a warp, of the fired solar cell element, on the basis of a difference in the thermal expansion coefficient between the aluminum electrode layer and the p type silicon semiconductor substrate. The total content of the one or more species of the inorganic compound particles, the organic compound particles and the carbon particles is preferably from 0.1 to 10% (inclusive) by mass. If the total content of the one or more species of the inorganic compound particles, the organic compound particles and the carbon particles is less than 0.1% by mass, the effect of the addition sufficient for preventing the warp cannot be obtained. If the content is more than 10% by mass, the electric resistance value of the aluminum electrode layer increases so that the sinterability of the paste may be hindered.

As the inorganic compound particles, any material can be preferably used as long as the material is inorganic compound powder wherein the thermal expansion coefficient is smaller than that of aluminum and any one of the melting temperature, the softening temperature and the decomposition temperature is higher than the melting point of aluminum. The average particle size of the inorganic compound particles is 10 μm or less, preferably 5 μm or less.

The organic compound particles may be made of polyethylene, polypropylene, acrylic resin, epoxy resin or the like. The average particle size of the organic compound particles is 10 μm or less, preferably 5 μm or less.

As the carbon powder, any material can be preferably used as long as the material is fine powder which is made of particularly, other than carbon black, carbon fiber, glassy carbon or the like and which has an average particle size of 1 μm or less, preferably 0.5 μm or less.

EXAMPLES

One example of the present invention will be described hereinafter.

First, produced were various paste compositions wherein 70% by mass of aluminum powder and percentages shown in Table 1 of a metal alkoxide, additive particles and glass frit were incorporated into an organic vehicle.

Specifically, various species of metal alkoxides were each added to an organic vehicle wherein a glycol ether organic solvent was used, and aluminum powder, additives particles and glass frit were added thereto in percentages shown in Table 1. The resultants were each mixed with a well-known mixer to yield paste compositions.

The used aluminum powder was powder made of particles having shapes of spheres having an average particle size of 0.5 to 10 μm, or shapes similar to the spheres from the viewpoints of keeping the reactivity with a p type silicon semiconductor substrate, applicability (paintability), and evenness of the film to be applied.

In the case that the particles were added, carbon particles having an average particle size of 0.025 μm or silicon oxide having an average particle size of 0.3 μm was used.

In the case that the glass frit was added, $Bi_2O_3$—$SiO_2$—$B_2O_3$ based glass having an average particle size of 1.5 μm was used as lead-free glass.

The paste compositions were each applied-printed onto a p type silicon semiconductor substrate having a size of 2 inches (50.8 mm)×2 inches (50.8 mm) and a thickness of 280 μm, using a screen printing plate of 180 meshes. The applied amount was set in such a manner that the thickness of an aluminum electrode layer after firing would be from 40 to 50 μm.

The p type silicon semiconductor substrates on which the pastes were each printed were dried, and fired under conditions that the substrates were heated in a temperature-raising rate of 400° C./minute and then the temperature was kept at 700° C. for 30 seconds in the atmosphere of air in an infrared firing furnace. After the firing, the substrates were cooled to yield samples each of which had an aluminum electrode layer 8 formed as a backside electrode on the p type silicon semiconductor substrate 1, as illustrated in FIG. 1.

Characteristics of each of the samples were evaluated as follows, and are shown in Table 1.

(Adhesive Property)

In accordance with an exfoliation test using a cellophane tape, the adhesive property between the fired aluminum electrode layer, wherein the aluminum electrode layer was formed, and the p type silicon semiconductor substrate was evaluated as follows:

○: the layer exfoliated, Δ: the layer exfoliated somewhat, and X: the layer exfoliated largely.

(External Appearance)

The external appearance of the fired aluminum electrode layer, wherein the aluminum electrode layer was formed, was evaluated with the naked eye as follows:

○: neither air bubbles nor cracking was generated, Δ: air bubbles or cracking was somewhat generated, and X: air bubbles or cracking was remarkably generated.

(Deformation Amount)

Figure 2:
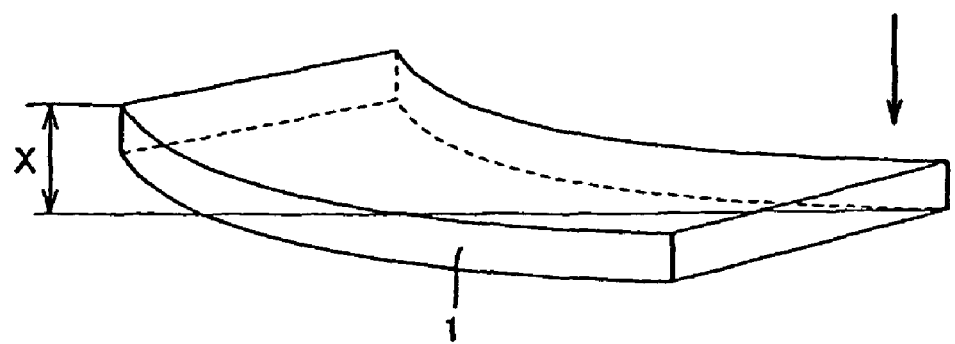
FIG. 2 is a view which schematically illustrates a method for measuring a deformation amount of a fired p type silicon semiconductor substrate on which an aluminum electrode layer was formed in working examples and prior art examples.

The deformation amount of the fired p type silicon semiconductor substrate on which the aluminum electrode layer was formed was evaluated by directing the aluminum electrode layer upwards as illustrated in FIG. 2 after the firing and cooling, pressing one out of four corners of the substrate, as represented by an arrow, and then measuring the rise amount x of one corner positioned diagonally thereto (including the thickness of the substrate). The rise amount x is shown as "deformation amount (mm)".

(Aluminum electrode layer surface resistance)

The surface resistance of the aluminum electrode layer was measured as an index of the energy converting efficiency when each of the samples was made into a solar cell element, using a four-point probe resistivity (sheet resistance meter, RG-5 model, manufactured by Napson Corp.). About conditions for the measurement, the voltage and the electric current were set to 4 mV and 100 mA, respectively, and the load applied to the surface was set to 200 grf (1.96 N). The measured value is shown as electrode layer surface resistance (mΩ/□).

($p^+$ layer surface resistance)

Thereafter, the p type silicon semiconductor substrate on which the aluminum electrode layer was formed was immersed into a solution of hydrochloric acid in water, thereby dissolving and removing the aluminum electrode layer 8. Thereafter, the surface resistance of the p type silicon semiconductor substrate 1 on which the $p^+$ layer 7 was formed was measured as an index of the BSF effect, using the four-point probe resistivity. The measured value is shown as $p^+$ layer surface resistance (Ω/□).

From the results in Tables 1 and 2, it is understood that in Examples, the adhesive property of the aluminum electrode layer is made better while the surface resistance of the aluminum electrode layer and that of the $p^+$ layer are maintained at substantially the same level than in Prior art examples. Furthermore, it is understood that in Examples, the deformation amount of the sintered p type silicon semiconductor substrate can be made lower than that of Prior art examples.

It should be considered that the embodiments and the examples disclosed above are illustrative in all points thereof, and are not restrictive. The scope of the invention is not specified by the above-mentioned embodiments or examples but is specified by the claims, and includes all modifications or variations within any meaning and scope equivalent to the claims.

INDUSTRIAL APPLICABILITY

According to the paste composition of this invention, even if glass frit is not incorporated, as a substance which is used when a backside aluminum electrode is formed on a p type

TABLE 1

| | Metal alkoxide | | | Glass frit (% by mass) | Additive particles [species] (% by mass) | Characteristics | | | | |
|---|---|---|---|---|---|---|---|---|---|---|
| | | | | | | Aluminum | | | | |
| | Ethyl silicate (% by mass) | Aluminum butoxide (% by mass) | Ethyl silicate hydrolyzed gel solution | | | electrode layer surface resistance (mΩ/□) | $P^+$layer surface resistance (Ω/□) | Adhesive property | External appearance, | Deformation amount (mm) |
| Prior art example 1 | — | — | — | 4 | — | 6.7 | 16.9 | Δ | ○ | 1.2 |
| Prior art example 2 | — | — | — | 2 | — | 5.9 | 17.2 | X | ○ | 1.1 |
| Example 1 | 10 | — | — | — | — | 3.0 | 16.3 | ○ | ○ | 0.5 |
| Example 2 | 5 | — | — | — | — | 5.5 | 20.5 | ○ | ○ | 0.5 |
| Example 3 | 1 | — | — | — | — | 4.5 | 19.2 | ○ | ○ | 0.6 |
| Example 2 | 10 | — | — | 1 | — | 4.9 | 16.7 | ○ | ○ | 0.5 |
| Example 4 | 5 | — | — | 2 | — | 5.4 | 17.6 | ○ | ○ | 0.6 |
| Example 6 | 1 | — | — | 3 | — | 5.9 | 15.5 | ○ | ○ | 0.7 |
| Example 7 | — | 17 | — | — | — | 4.4 | 19.2 | ○ | ○ | 0.5 |
| Example 8 | — | 5 | — | — | — | 4.9 | 23.1 | ○ | ○ | 0.6 |
| Example 9 | — | 1 | — | 2 | — | 5.5 | 18.3 | ○ | ○ | 0.8 |
| Example 10 | — | — | 14 | — | — | 3.7 | 20.7 | ○ | ○ | 0.6 |
| Example 11 | — | — | 8 | — | — | 5.9 | 22.4 | ○ | ○ | 0.5 |
| Example 12 | — | — | 2 | — | — | 5.4 | 18.9 | ○ | ○ | 0.7 |
| Example 13 | — | — | 2 | 2 | — | 6.3 | 23.7 | ○ | ○ | 0.7 |
| Example 14 | 1 | — | — | — | [Carbon] 0.02 | 5.0 | 20.4 | ○ | ○ | 0.8 |
| Example 15 | 1 | — | — | — | [Carbon] 0.1 | 5.0 | 19.3 | ○ | ○ | 0.6 |
| Example 16 | 1 | — | — | — | [Carbon] 0.3 | 5.0 | 22.2 | ○ | ○ | 0.6 |
| Example 17 | 1 | — | — | — | [Carbon] 0.5 | 6.5 | 22.7 | ○ | ○ | 0.5 |
| Example 18 | 1 | — | — | — | [Silicon oxide] 3 | 7.2 | 16.9 | ○ | ○ | 0.8 |
| Example 19 | 1 | — | — | — | [Silicon oxide] 8 | 6.7 | 19.2 | ○ | ○ | 0.7 |

In order to improve the adhesive properties of samples of Prior art examples 1 and 2, samples fired under conditions of keeping a temperature of 750° C. for 30 seconds were produced, and evaluated. The results are shown in Table 2.

silicon semiconductor substrate constituting a crystalline silicon solar cell and gives a bad effect on the environment, into the composition or the content of glass frit as a substance giving a bad effect on the environment therein is decreased, a

TABLE 2

| | | Characteristics | | | | |
|---|---|---|---|---|---|---|
| | Glass frit (% by mass) | Aluminum electrode layer surface resistance (mΩ/□) | $P^+$layer surface resistance (Ω/□) | Adhesive property | External appearance | Deformation amount (mm) |
| Prior art example 3 | 4 | 7.7 | 19.7 | ○ | X | 1.5 |
| Prior art example 4 | 2 | 8.2 | 22.1 | ○ | Δ | 1.6 | desired BSF function for the backside electrode of the solar cell and a desired energy converting efficiency of the solar cell can be maintained, and further the bond between the aluminum electrode layer and the p type silicon semiconductor substrate can be strengthened in the solar cell element.

The invention claimed is:

1. A paste composition for forming an electrode over a p type silicon semiconductor substrate, comprising aluminum powder. an organic vehicle, and a metal oxide in the state of a sol and/or gel obtained by hydrolyzing a metal alkoxide and polycondensing the resultant, wherein the organic vehicle comprises an organic solvent selected from the group consisting of diethylene glycol monobutyl ether, diethylene glycol monobutyl ether acetate and dipropylene glycol monomethyl ether.

2. The paste composition according to claim 1 which comprises 60 through 75% by mass of the aluminum powder, 10 through 35% by mass of the organic vehicle, and 0.1 through 20% by mass of the sol and/or gel.

3. The paste composition according to claim 1, wherein the metal alkoxide is an metal alkoxide containing silicon as the metal thereof.

4. The paste composition according to claim 1, which further comprises particles of at least one species selected from the group consisting of inorganic compound particles, organic compound particles and carbon particles.

5. The paste composition according to claim 4, wherein an average particle size of the inorganic compound particles and/or the organic compound particles is 10 μm or less.

6. The paste composition according to claim 4, wherein an average particle size of the carbon particles is 1 μm or less.

7. The paste composition according to claim 1, which further comprises glass frit.

* * * * *